(12) United States Patent
Han

(10) Patent No.: US 8,362,523 B2
(45) Date of Patent: Jan. 29, 2013

(54) INTEGRATED CIRCUIT DEVICES HAVING HIGH DENSITY LOGIC CIRCUITS THEREIN POWERED USING MULTIPLE SUPPLY VOLTAGES

(75) Inventor: SangShin Han, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 185 days.

(21) Appl. No.: 13/018,568

(22) Filed: Feb. 1, 2011

(65) Prior Publication Data

US 2011/0233629 A1  Sep. 29, 2011

(30) Foreign Application Priority Data

Mar. 26, 2010  (KR) ........................ 10-2010-0027447

(51) Int. Cl.
*H01L 27/105* (2006.01)
*H01L 27/118* (2006.01)
(52) U.S. Cl. . 257/202; 257/207; 257/208; 257/E27.029; 257/E27.062; 257/E27.107; 257/E23.153
(58) Field of Classification Search ............... 257/202, 257/207, 208, E27.029, E27.062, E27.107, 257/E23.153
See application file for complete search history.

(56) References Cited

U.S. PATENT DOCUMENTS

| 5,780,881 | A | 7/1998 | Matsuda et al. |
| 7,436,205 | B2 * | 10/2008 | Tada ............................. 326/33 |
| 7,436,712 | B2 * | 10/2008 | Ogura et al. ............ 365/185.23 |
| 7,660,141 | B2 * | 2/2010 | Chang ............................. 365/63 |
| 7,667,484 | B2 * | 2/2010 | Tada ............................. 326/33 |
| 8,120,959 | B2 * | 2/2012 | Lee et al. ................. 365/185.13 |

FOREIGN PATENT DOCUMENTS

| JP | 08-330552 | 12/1996 |
| JP | 09-153551 | 6/1997 |
| JP | 2007-073885 | 3/2007 |

\* cited by examiner

*Primary Examiner* — Evan Pert
(74) *Attorney, Agent, or Firm* — Myers Bigel Sibley & Sajovec, P.A.

(57) ABSTRACT

Integrated circuit devices include a substrate having a semiconductor substrate region therein containing multiple well regions of different conductivity type. A first semiconductor well region of first conductivity type is provided in the semiconductor substrate region. This first semiconductor well region has a first plurality of transistor regions therein arranged in a first zig-zag pattern extending across the semiconductor substrate region. A second semiconductor well region of second conductivity type is also provided in the semiconductor substrate region. This second semiconductor well region has a second plurality of transistor regions therein arranged in a second zig-zag pattern extending across the semiconductor substrate region. This second zig-zag pattern is intertwined with the first zig-zag pattern. A plurality of first transistors of second conductivity type are provided in the first plurality of transistor regions and a plurality of second transistors of first conductivity type are provided in the second plurality of transistors regions.

20 Claims, 10 Drawing Sheets

US 8,362,523 B2

INTEGRATED CIRCUIT DEVICES HAVING HIGH DENSITY LOGIC CIRCUITS THEREIN POWERED USING MULTIPLE SUPPLY VOLTAGES

REFERENCE TO PRIORITY APPLICATION

This application claims priority to Korean Patent Application No. 10-2010-0027447, filed Mar. 26, 2010, the contents of which are hereby incorporated herein by reference.

FIELD

The present invention relates to integrated circuit devices and, more particularly, to integrated circuit devices using a plurality of voltages and a computing system including the same.

BACKGROUND

In recent years, there are needs for, improved operating frequency of a logic circuit and low power consumption in a semiconductor integrated circuit device. When the level of a voltage applied to a logic circuit in a semiconductor integrated circuit device increases, operating speed of the logic circuit is improved while power consumption thereof increases. When the level of the voltage applied to the logic circuit decreases, power consumption of the logic circuit decreases while operating speed thereof is reduced.

Based on the relationship between power consumption and operating speed of a logic circuit, a semiconductor integrated circuit device may be provided with a logic circuit receiving a high voltage and a logic circuit receiving a low voltage. For example, a high voltage may be applied to a logic circuit requiring a high-speed operating frequency and a low voltage may be applied to a logic circuit requiring a low-speed operating frequency. Thus, power consumption of the logic circuit may decrease.

In this case, the semiconductor integrated circuit device may be provided with an additional logic circuit receiving both high and low voltages. The additional logic circuit may provide a data communication function between a logic circuit using a high voltage and a logic circuit using a low voltage.

SUMMARY

Integrated circuit devices according to embodiments of the invention include a substrate having a semiconductor substrate region therein containing multiple well regions of different conductivity type. According to some of these embodiments of the invention, a first semiconductor well region of first conductivity type is provided in the semiconductor substrate region. This first semiconductor well region has a first plurality of transistor regions therein arranged in a first zig-zag pattern extending across the semiconductor substrate region. At least some of the first plurality of transistor regions may have unequal widths when measured in a first direction along a length of the first zig-zag pattern. A second semiconductor well region of second conductivity type is also provided in the semiconductor substrate region. This second semiconductor well region has a second plurality of transistor regions therein arranged in a second zig-zag pattern extending across the semiconductor substrate region. This second zig-zag pattern is intertwined with the first zig-zag pattern. A plurality of first transistors of second conductivity type may be provided in the first plurality of transistor regions and a plurality of second transistors of first conductivity type may be provided in the second plurality of transistors regions. In some embodiments of the invention, the plurality of second transistors may include at least one second transistor that shares a gate electrode with a corresponding one of the plurality of first transistors.

According to still further embodiments of the invention, the second plurality of transistor regions may be contiguous with each other within the first semiconductor well region. In addition, at least some of the first plurality of transistor regions may be contiguous with each other. The second semiconductor well region may also form P-N rectifying junctions with the first semiconductor well region. This first semiconductor well region of first conductivity type may be an N-type region and the second semiconductor well region of second conductivity type may be a P-type region or vice versa. The plurality of first transistors of second conductivity type may be PMOS transistors and the plurality of second transistors of first conductivity type may be NMOS transistors or vice versa. Moreover, at least some of the PMOS transistors may be electrically coupled to power supply signal lines biased at unequal power supply voltages (e.g., VDD1, VDD2).

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION OF THE EMBODIMENTS

The inventive concept will now be described more fully hereinafter with reference to the accompanying drawings, in which preferred embodiments of the inventive concept are shown.

Figure 1:
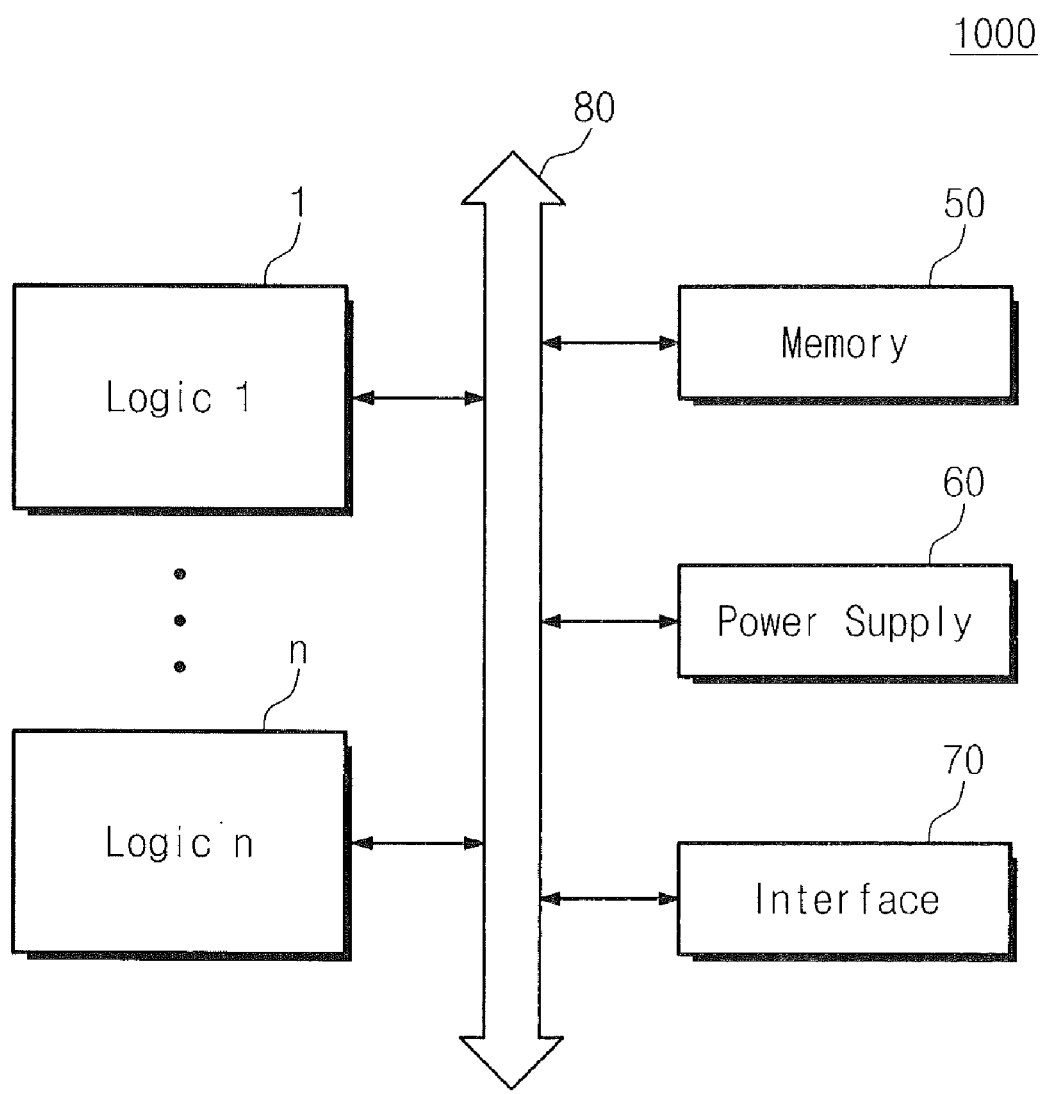
FIG. 1 is a block diagram of a computing system including first to nth logics.

FIG. 1 is a block diagram of a computing system 1000 including first to nth logics. As illustrated, the computing system 1000 includes first to nth logics 1~n, a memory 50, a power supply 60, an interface 70, and a system bus 80. The first to nth logic 1~n are electrically connected to the memory 50, the power supply 60, and the interface 70 through the system bus 80. The first to nth logics 1~n receive an input signal (not shown) from the interface 70 or the memory 50 through the system bus 80 and process data. The interface 70 may include at least one of a user interface and an interface capable of communicating with other devices.

The processed data may be transmitted to the interface 70 or the memory 50 through the system bus 80. Data provided by the interface 70 or data processed by the first to nth logics 1~n is stored in the memory 50. The power supply 60 is configured to supply power to respective components of the computing system 1000. The power supply 60 generates voltages having at least two levels. The power supply 60 may supply the voltages having at least two levels to the first to nth logics 1~n.

The computing system 1000 may one of various elements of an electronic device, such as a computer, a mobile computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a portable game console, a navigation system, a black box, a digital camera, a digital audio recorder, a digital audio player, a digital picture recorder, a digital picture player, a digital video recorder, a digital video player, a device that is able to transmit and receive information in a wireless circumstance, one of various devices composing a home network, one of various devices composing a computer network, one of various devices composing a telematics network, or a radio frequency identifier (RFID) device.

Figure 2:
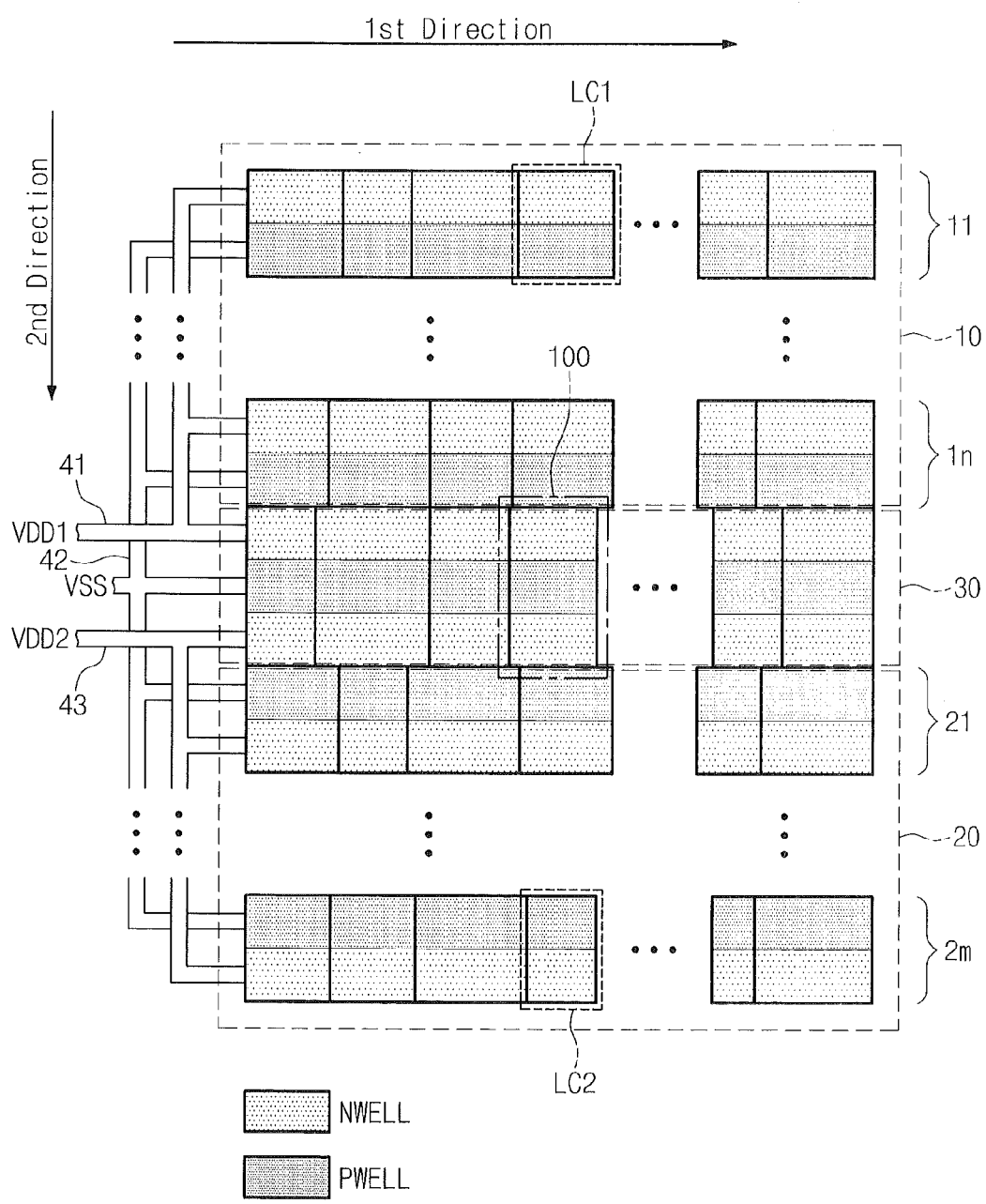
FIG. 2 is a layout diagram of a first logic shown in FIG. 1.

FIG. 2 is a layout diagram of the first logic 1 shown in FIG. 1. As illustrated, the first logic 1 includes a first logic circuit 10, a second logic circuit 30, and a common logic circuit 20. Each of the logic circuits 10,20, and 30 includes a plurality of logic cells. The first logic circuit 10 includes logic cells 11~1n of first to nth lines, and the second logic circuit 20 includes logic cells 21~2m of first to mth lines.

A logic cell is a basic unit for performing a logical operation. As an example, a logic cell may include an inverter to output "0" when "1" is input. A size of each logic cell may vary with computational complexity. As an example, the number of transistors disposed at a logic cell may vary depending on what logical operation is performed at a logic cell, and a size of the logic cell may vary with increase or decrease in number of the transistors disposed therein. As an example, when a size of each logic cell varies, an area of the logic cell may increase in a first direction.

A first power supply voltage VDD1 is supplied to the first logic circuit 10 and the common logic circuit 30 through a first conductive line 41. A second power supply voltage VDD2 is supplied to the second logic circuit 20 and the common logic circuit 30 through a third conductive line 43. A ground voltage VSS is supplied to the first logic circuit 10, the second logic circuit 20, and the common logic circuit 30 through a second conductive line 42.

Accordingly, the first power supply voltage VDD1 and the ground voltage VSS are supplied to logic cells of the first logic circuit 10. The second power supply voltage VDD2 and the ground voltage VSS are supplied to logic cells of the second logic circuit 20. The first power supply voltage VDD1, the second power supply voltage VDD2, and the ground voltage VSS are supplied to logic cells of the common logic circuit 30.

At the first logic circuit 10, the common logic circuit 30, and the second logic circuit 20, N-wells and P-wells extend in the first direction and are alternately arranged in a second direction. As an example, at the first logic cells 100, an N-well and a P-well extend in the first direction and are sequentially arranged in the second direction. As an example, at the common logic circuit 30, an N-well, a P-well, and an N-well extend in the first direction and N-wells and a P-well are sequentially arranged in the second direction.

Logic cells of the first and second logic circuits 10 and 20 are formed at a pair of N-well and P-well regions. As an example, a logic cell LC1 of the first logic circuit 10 and a logic cell LC2 of the second logic circuit 20 are formed at the N-well region and the P-well region.

Logic cells of the common logic circuit 30 are formed at two N-wells and a P-well region. Two N-wells and a P-well are disposed at the logic cells of the common logic circuit 30, so that the logic cells of the common logic circuit 30 may include transistors using the first power supply voltage VDD1, the second power supply voltage VDD2, and the ground voltage VSS.

As an example, at logic cells of the common logic circuit 30, transistors may be disposed on one of the two N-wells and the first power supply voltage VDD1 may be supplied to the transistors. At the logic cells of the common logic circuit 30, transistors may be disposed at the other N-well and the second power supply voltage VDD2 may be supplied to the transistors. Transistors may be disposed on the P-well of the logic cells of the common logic circuit 30, and the ground voltage VSS may be supplied to the transistors.

Based on the fact that the first power supply voltage VDD1, the second power supply voltage VDD2, and the ground voltage are supplied to the common logic circuit 30, the common logic circuit 30 may provide a data communication function between the first logic circuit 10 and the second logic circuit 20.

Figure 3:
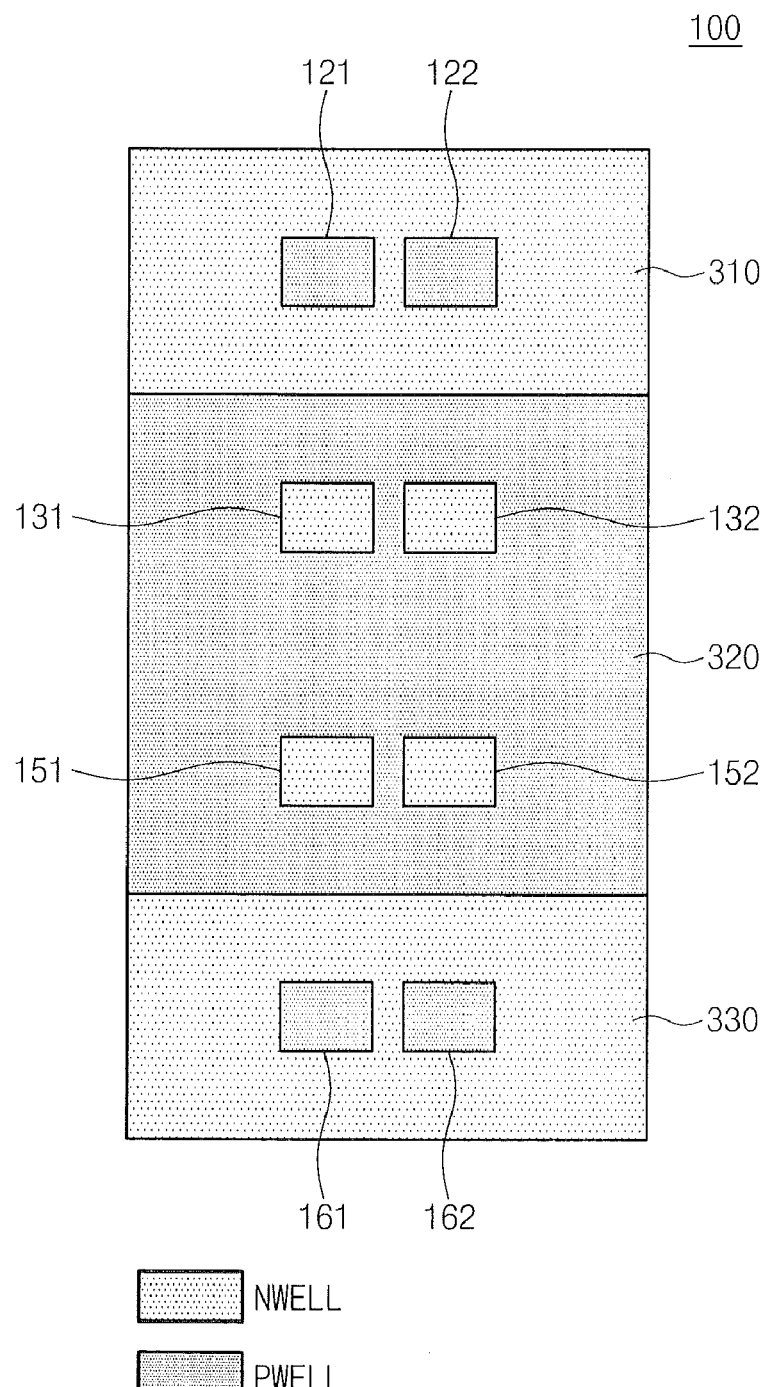
FIGS. 3 to 5 are top plan views illustrating a procedure of forming an inverter at a first logic cell of a common logic circuit shown in FIG. 2.
Figure 4:
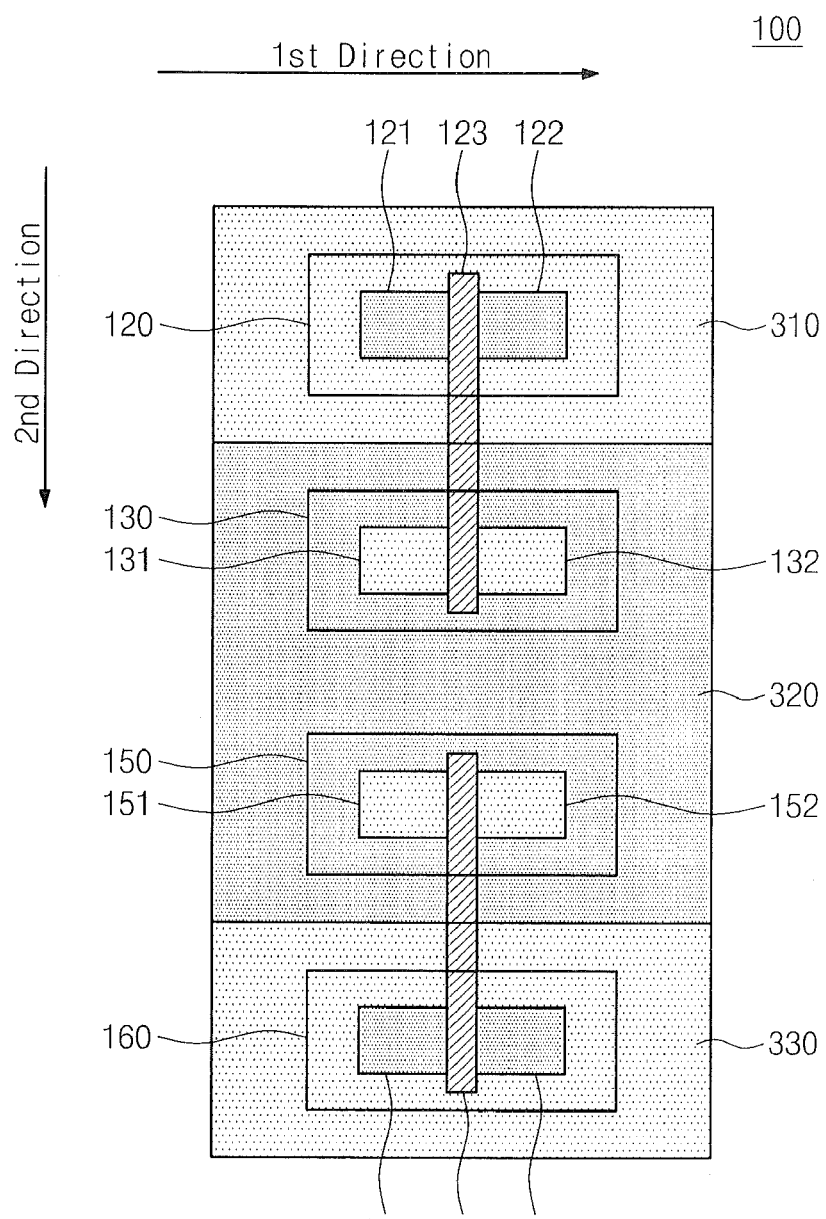
Figure 5:
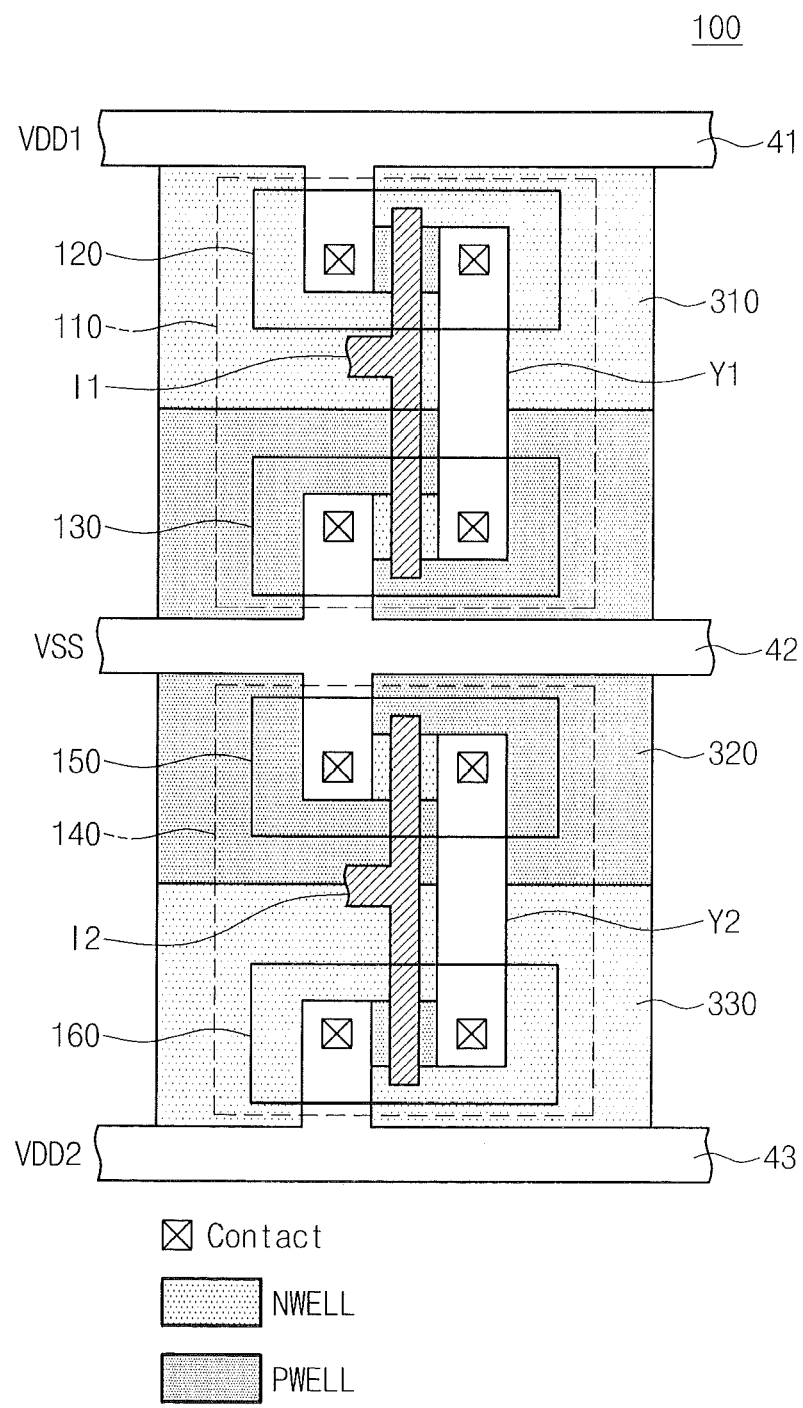

FIGS. 3 to 5 are top plan views illustrating a procedure of forming an inverter at a first logic cell 100 of the common logic circuit 30 shown in FIG. 2. Referring to FIG. 3, the first logic cell 100 includes first to third regions 310, 320, and 330. An N-well is formed at the first region 310, a P-well is formed at the second region 320, and an N-well is formed at the third region 330. A first P-well 121 and a second P-well 122 are disposed at the first region 310. Each of the first and second P-wells 121 and 122 may have a higher concentration than a P-well formed at the second region 320. A first N-well 131, a second N-well 132, a third N-well 151, and a fourth N-well 152 are disposed at the second region 320. Each of the first to fourth N-wells 131, 132, 151, and 152 may have a higher concentration than each of the N-wells formed at the first and third regions 310 and 330. A third P-well 161 and a fourth P-well 162 may be disposed at the third region 330. Each of the third and fourth P-wells 161 and 162 may have a higher concentration than the P-well formed at the second region 320.

Referring to FIG. 4, first conductive materials 123 are disposed between the first and second P-wells 121 and 122 and between the first and second N-wells 131 and 132, extend in a second direction, and are connected to each other. Alternatively, the first conductive material 123 may include polysilicon. For example, the first conductive material 123 may include a metallic material such as tungsten (W) and aluminum (Al), or a metal silicide.

The first conductive material 123 disposed between the first and second P-wells 121 and 122 functions as a gate, and the first conductive material 123 disposed between the first and second N-wells 131 and 132 also functions as a gate. That is, the first and second P-wells 121 and 122 constitute a first transistor 120 together with the first conductive material 123. In addition, the first and second N-wells 131 and 132 may constitute a second transistor 130 together with the first conductive material 123. When a voltage higher than a predetermined voltage is applied to the first conductive material 123, the first N-well 131 and the second N-well 132 are electrically connected to each other. When a voltage lower than a predetermined voltage is applied to the first conductive material 123, the first P-well 121 and the second P-well 122 are electrically connected to each other.

Second conductive materials 124 are disposed between the third and fourth N-wells 151 and 152 and between the third and fourth P-wells 161 and 162 and extend in the second direction to be connected to each other. For example, the second conductive material 124 may include polysilicon, or a metallic material such as tungsten (W) and aluminum (Al), or a metal silicide.

The second conductive material 124 disposed between the third and fourth N-wells 151 and 152 functions as a gate, and the second conductive material 124 disposed between the third and fourth P-wells 161 and 162 also functions as a gate. That is, the third and fourth N-wells 151 and 152 constitute a third transistor 150 together with the second conductive material 124. In addition, the third and fourth P-wells 161 and 162 may constitute a fourth transistor 160 together with the second conductive material 124. When a voltage higher than a predetermined voltage is applied to the second conductive material 124, the third N-well 151 and the fourth N-well 152 are electrically connected to each other. When a voltage lower than a predetermined voltage is applied to the second conductive material 124, the third P-well 161 and the fourth P-well 162 are electrically connected to each other.

Referring to FIG. 5, at the first transistor 120, a first power supply voltage VDD1 is supplied to the first P-well 121 through a first conductive line 41. At the second transistor 130, a ground voltage VSS is supplied to the first N-well 131 through a second conductive line 42. The second P-well 122 and the second N-well 132 are connected to a first output terminal Y1. An output signal of the first output terminal Y1 may be an input signal of a first logic circuit (10 in FIG. 2) and a second logic circuit (20 in FIG. 2). The first conductive material 123 is connected to a first input terminal It A signal input through the first input terminal I1 may be received from logic cells of the first logic circuit 10 or the second logic circuit 20. That is, the first and second transistors 120 and 130, the first and second conductive lines 41 and 42, the first input terminal I1, and the first output terminal Y1 constitute a first inverter 110.

When a high-level signal is received from the first input terminal 11, the first transistor 120 is turned off while the second transistor 130 is turned on. That is, the second N-well 132 is electrically connected to the first N-well 131. Accordingly, a low-level signal corresponding to the ground voltage VSS is output at the first output terminal Y1. When a low-level signal is received from the first input terminal 11, the first transistor 120 is turned on while the second transistor 130 is turned off. Accordingly, a high-level signal corresponding to the first power supply voltage VDD1 is output at the first output terminal Y1.

At the fourth transistor 160, the second power supply voltage VDD2 is supplied to the third P-well 161 through the second conductive line 43. At the third transistor 150, the ground voltage VSS is supplied to the third N-well 151 through the second conductive line 42. The fourth N-well 152 and the fourth P-well 162 are connected to a second output terminal Y2. An output signal of the second output terminal Y2 may be an input signal of logic cells of the first logic circuit 10 or the second logic circuit 20. The second conductive material 124 is connected to a second input terminal 12. That is, the third and fourth transistors 150 and 160, the second and third conductive lines 42 and 43, the second input terminal 12, and the second output terminal Y2 constitute a second inverter 140.

When a high-level signal is received from the second input terminal 12, the third transistor 150 is turned on while the fourth transistor 160 is turned off. Accordingly, a low-level signal corresponding to the ground voltage VSS is output at the second output terminal Y2. When a low-level signal is received from the second input terminal 12, the third transistor 150 is turned on while the fourth transistor 160 is turned on. In this case, a high-level signal corresponding to the second power supply voltage VDD2 is output at the second output terminal Y2.

When the function or peripheral environment of each logic cell changes, the configuration thereof may also change. For example, at the first logic cell 100, transistors of the first inverter 110 may increase in number when equivalent impedance of logic cells receiving a signal output from the first output terminal Y1 increases.

Figure 6:
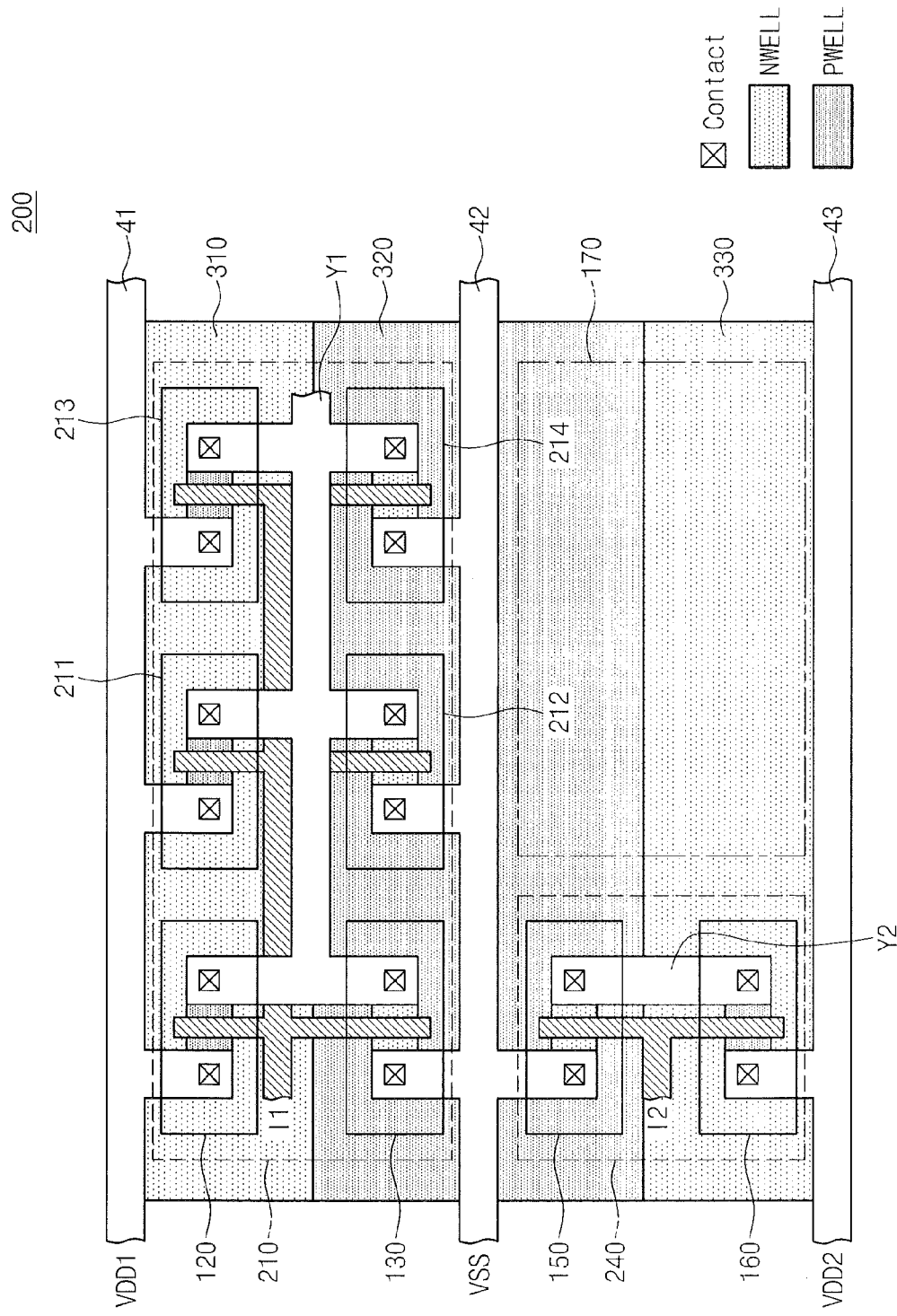
FIG. 6 is a top plan view illustrating another example of the first logic cell shown in FIG. 2.

FIG. 6 is a top plan view illustrating another example of the first logic cell 100 shown in FIG. 2. The first logic cell 200 includes first, second, and third regions 310, 320, and 330. An N-well is formed at the first region 310, a P-well is formed at the second region 320, and an N-well is formed at the third region 330. The first logic cell 200 includes third and fourth inverters 210 and 240. The third inverter 210 is disposed at the first and second regions 310 and 320, and the fourth inverter 240 is disposed at the second and third regions 320 and 330.

The third inverter 210 includes a first transistor 120, a second transistor 130, and fifth to eighth transistors 211214. The first transistor 120, the fifth transistor 211, and the seventh transistor 213 are disposed at the first region 310 where an N-well is formed. The second transistor 130, the sixth transistor 212, and the eighth transistor 214 are formed at the second region 320 where a P-well is formed. A first power supply voltage VDD1 is supplied to the first transistor 120, the fifth transistor 211, and the seventh transistor 213 through a first conductive line 41. A ground voltage VSS is supplied to the second transistor 130, the sixth transistor 212, and the eighth transistor 214 through a second conductive line 42. Gates of the first and second transistors 120 and 130, gates of the fifth and sixth transistors 211 and 212, and gates of the seventh and eighth transistors 213 and 214 are connected to a first input terminal I1.

When a low-level signal is input to the first input terminal I1, the first transistor 120, the fifth transistor 211, and the seventh transistor 213 are turned on while the second transistor 130, the sixth transistor 212, and the eighth transistor 214 are turned off. Thus, a high-level signal corresponding to the first power supply voltage VDD1 is output at a first output terminal Y1.

When a high-level signal is input to the first input terminal I1, the first transistor 120, the fifth transistor 211, and the seventh transistor 213 are turned off while the second transistor 130, the sixth transistor 212, and the eighth transistor 214 are turned on. Thus, a low-level signal corresponding to the ground voltage VSS is output at the first output terminal Y1. The fourth inverter 240 includes a third transistor 150 and a fourth transistor 160. The third transistor 150 is disposed at the second region 320 where a P-well is formed, and the fourth transistor 160 is disposed at the third region 330 where an N-well is formed. The ground voltage VSS is supplied to the third transistor 150 through a second conductive line 42. A second power supply voltage VDD2 is supplied to the fourth transistor 160 through a third conductive line 43. Gates of the third and fourth transistors 150 and 160 are connected to a second input terminal 12. As described with reference to FIG. 5, a high-level signal is output at a second output terminal Y2 when a low-level signal is received at a second input terminal 12.

As described with reference to FIG. 6, the third and fourth inverters 210 and 240 include different numbers of transistors. That is, the third and fourth inverters 210 and 240 are different in size. In this case, there may be a waste space 170 when logic ells are formed on the first to third regions 310, 320, and 330 that are disposed in parallel.

Figure 7:
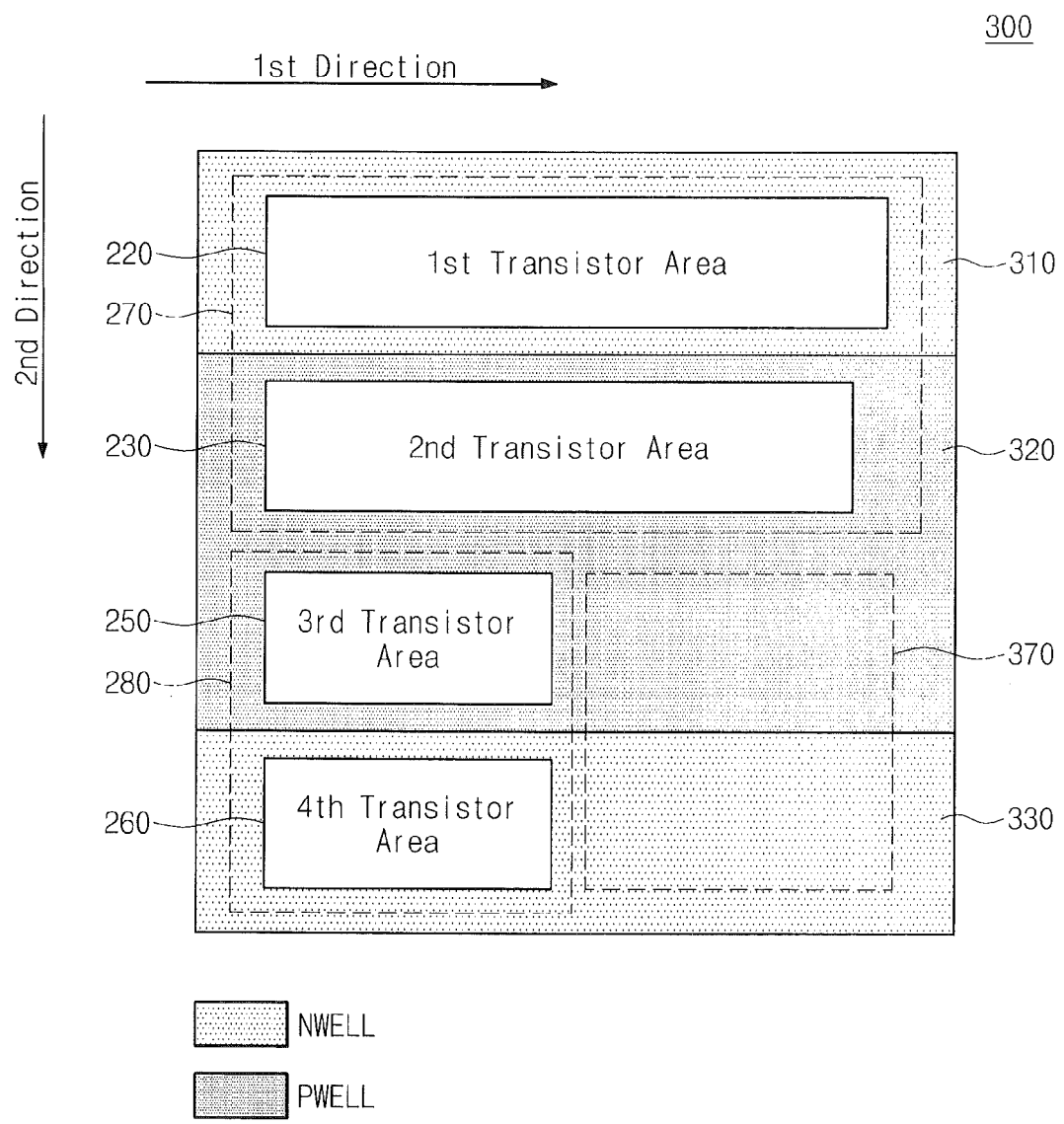
FIG. 7 is a top plan view illustrating another example of the first logic cell shown in FIG. 2.

FIG. 7 is a top plan view illustrating another example of the first logic cell 100 shown in FIG. 2. A first logic cell 300 includes a first region 310 where an N-well is formed, a second region 320 where a P-well is formed, and a third region 330 where an N-well is formed. The first region 310, the second region 320, and the third region 330 extend in a first direction and are sequentially disposed in a second direction. The first region 310 includes a first transistor region 220. The second region 320 includes second and third transistor regions 230 and 250. The third region 330 includes a fourth transistor region 260.

The first transistor region 220 includes transistors disposed at the first region 310. The second and third transistors 230 and 350 include transistors disposed at the second region 310. The fourth transistor region 260 includes transistors disposed at the third region 330. For example, the first transistor region 220 includes the first transistor 120, the fifth transistor 211, and the seventh transistor 213 shown in FIG. 6. For example, the second transistor region 230 includes the second transistor 130, the sixth transistor 212, and the eighth transistor 214 shown in FIG. 6.

As an example, as shown in FIGS. 3 to 6, the first logic cell 300 includes an inverter. However, the inventive concept is not limited to the fact that each logic cell includes an inverter. For example, logic cells may be configured to perform AND, OR, NOR, NAND, or XOR operations. Logic cells may also include capacitors.

The first and second transistor regions 220 and 230 constitute a first transistor unit 270, and the third and fourth transistor regions 250 and 260 constitute a second transistor unit 280. For example, the first transistor unit 270 includes the third inverter 210 shown in FIG. 6 and the second transistor unit 280 includes the fourth inverter shown in FIG. 6. For example, similar to the first to fourth inverters 110, 140, 210, and 240 described with reference to FIG. 5 or 6, the first transistor 270 or the second transistor 280 may perform a logical operation to output a low-level signal as a high-level signal or vice versa.

A first power supply voltage (VDD1 in FIG. 2) is supplied to transistors of the first transistor region 220. A ground voltage (VSS in FIG. 2) is supplied to transistors of the second and third transistor regions 230 and 250. A second power supply voltage (VDD2 in FIG. 2) is supplied to transistors of the fourth transistor region 260. At the first transistor unit 270, the first transistor region 220 and the second transistor regions 230 are disposed in a second direction. At the second transistor unit 280, the third transistor region 250 and the fourth transistor regions 260 extend in the second direction. The first transistor unit 270 and the second transistor units 280 are disposed in a first direction.

Areas of the first to fourth transistor regions 220, 230, 250, and 260 may increase or decrease. For example, the areas of the first to fourth transistor regions 220, 230, 250, and 260 may vary with the number of transistors. The number of transistors included in the first to fourth transistor regions 220, 230, 250, and 260 may vary with change of a logical operation that must be performed. In this case, the areas of the first to fourth transistor regions 220, 230, 250, and 260 may increase or decrease in the first direction or an opposite direction to the first direction. Thus, the first logic cell 300 may increase or decrease in the first direction or the opposite direction to the first direction.

The first logic cell 300 includes a waste area 370, which is disposed from the second transistor Unit 280 in the first direction. As an example, as described with reference to FIG. 6, the waste area 370 may be formed due to a difference in size between the first transistor unit 270 and the second transistor unit 280. That is, the waste area 370 is formed because the first to third regions 310, 320, and 330 are sequentially formed in the second direction and the first to fourth transistor regions 220, 230, 250, and 260 are sequentially disposed in the second direction while the areas of the first to fourth transistor regions 220, 230, 250, and 260 increase or decrease in the first direction or the opposite direction to the first direction.

Similarly, a waste area may be formed when areas of the third and fourth transistor regions 250 and 260 are greater than those of the first and second transistor regions 220 and 230.

Figure 8:
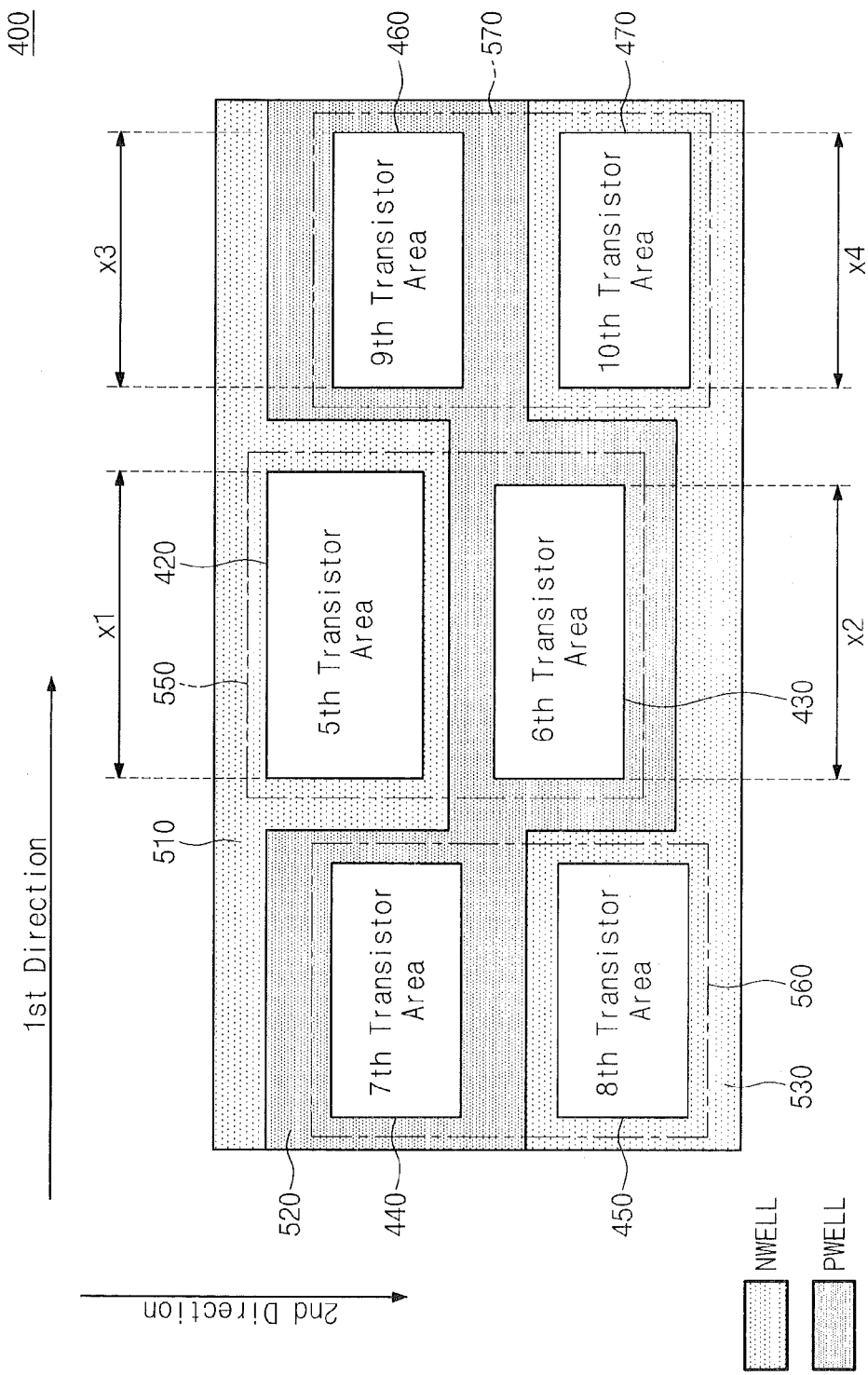
FIG. 8 is a top plan view illustrating another example of the first logic cell shown in FIG. 2.

FIG. 8 is a top plan view illustrating another example of the first logic cell 100 shown in FIG. 2. Referring to FIG. 8, the first logic cell 100 includes a first region 510, a second region 520, and third regions 530. In the first logic cell 400, an N-well is formed at the first region 510, a P-well is formed at the second region 520, and an N-well is formed at the third region 530. The first region 510, the second region 520, and the third regions 530 are sequentially disposed in a second direction.

The first logic cell 400 includes fifth to tenth transistor regions 420-470. The fifth transistor region 420 is disposed on the first region 510. The sixth transistor region 430, the seventh transistor region 440, and the ninth transistor region 460 are disposed on the second region 520. The eighth transistor region 450 and the tenth transistor region 470 are disposed on the third region 530. As described with reference to FIGS. 3 to 5, transistors of the fifth transistor region 420 may function as PMOS transistors. Transistors of the sixth, seventh, and ninth transistor regions 430, 440, and 460 may function as NMOS transistors. Transistors of the eighth and tenth transistor regions 450 and 470 may function as PMOS transistors.

The fifth and seventh transistor regions 420 and 430 constitute a third transistor unit 550 and are disposed in the second direction. The seventh and eighth transistor regions 440 and 450 constitute a fourth transistor unit 560 and are disposed in the second direction. The ninth and tenth transistor regions 460 and 470 constitute a fifth transistor unit 570 and are disposed in the second direction. The third, fourth, and fifth transistor units 550, 560, and 570 may be configured to perform a predetermined logic operation. For example, similar to the inverters 210 and 240 described with reference to FIG. 6, the third, fourth, and fifth transistor units 550, 560, and 570 may be configured to output "1" when "0" is input and output "0" when "1" is input.

A first power supply voltage VDD1 is supplied to transistors disposed at the first region 510. A ground voltage VSS is supplied to transistors disposed at the second region 520. A second power supply voltage VDD2 is supplied to transistors disposed at the third region 530. That is, the first power supply voltage VDD1 is supplied to transistors of the fifth transistor region 420 and the ground voltage VSS is supplied to transistors of the sixth transistor region 430. Thus, the third transistor unit 550 functions as a logic circuit using the first power supply voltage VDD1.

The second power supply voltage VDD2 is supplied to transistors of the eighth transistor region 450 and the ground voltage VSS is supplied to transistors of the seventh transistor region 430. Thus, the fourth transistor unit 560 functions as a logic circuit using the second power supply voltage VDD2. The second power supply voltage VDD2 is supplied to transistors of the tenth transistor region 470 and the ground voltage VSS is supplied to transistors of the ninth transistor region 460. Thus, the fifth transistor unit 570 functions as a logic circuit using the second power supply voltage VDD2. Since the first logic cell 400 includes the third to fifth transistor units 550, 560, and 570, it includes a logic circuit using the first power supply voltage VDD1 and a logic circuit using the second power supply voltage VDD2.

In FIG. 7, the first and second transistor units 270 and 280 are disposed in the second direction. Meanwhile, in FIG. 8, the third and fifth transistor units 550 and 570 are disposed in the first direction, and the fourth and third transistor units 560 and 550 are also disposed in the first direction. The seventh, fifth, and ninth transistor regions 440, 420, and 460 are sequentially disposed in the first direction. The seventh and eighth transistor regions 440 and 450, the fifth and sixth transistor regions 420 and 430, and the ninth and tenth transistor regions 460 and 470 are disposed in the second direction.

Figure 9:
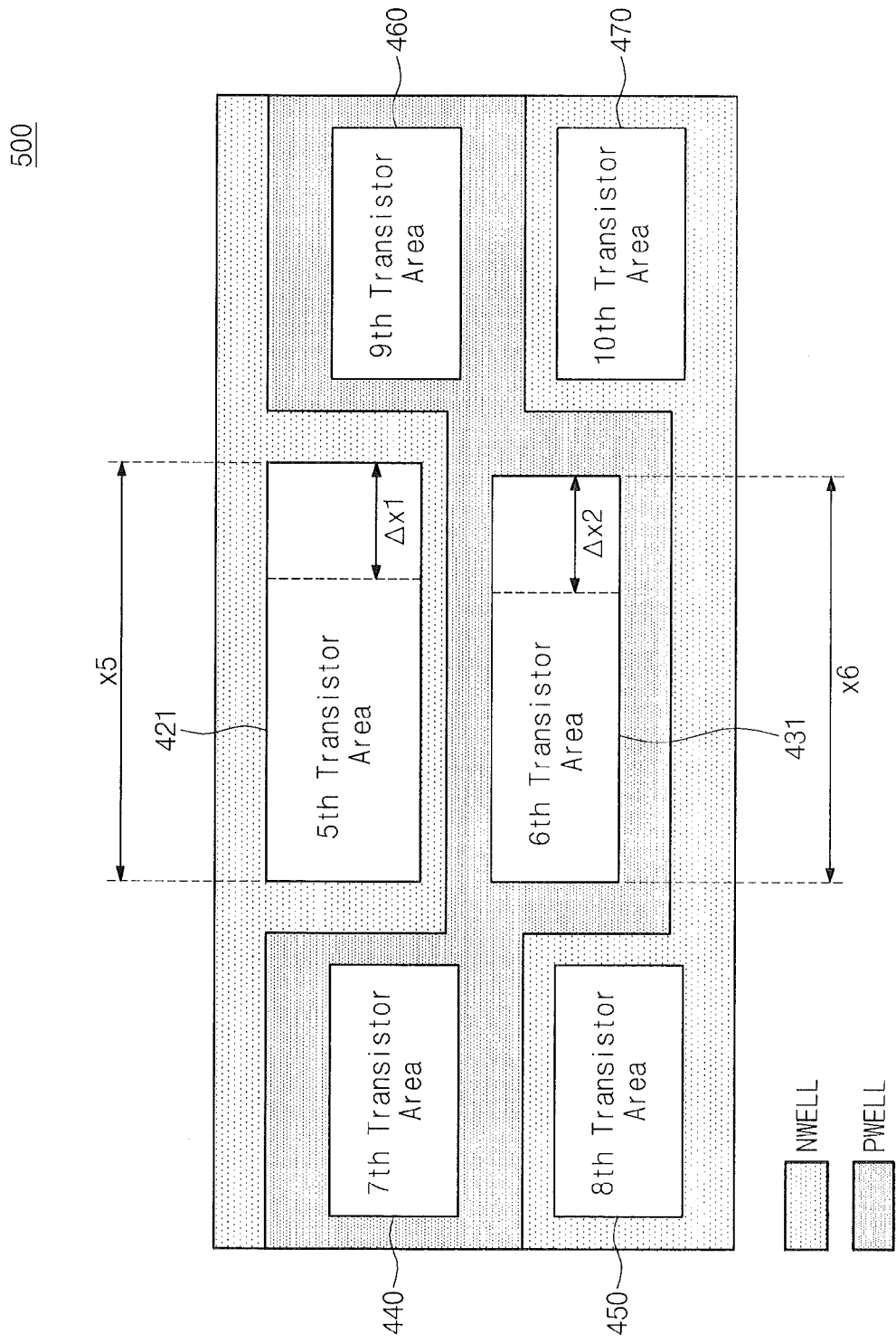
FIG. 9 is a block diagram illustrating an example in the case where fifth to tenth transistors shown in FIG. 8 change in area.
Figure 10:
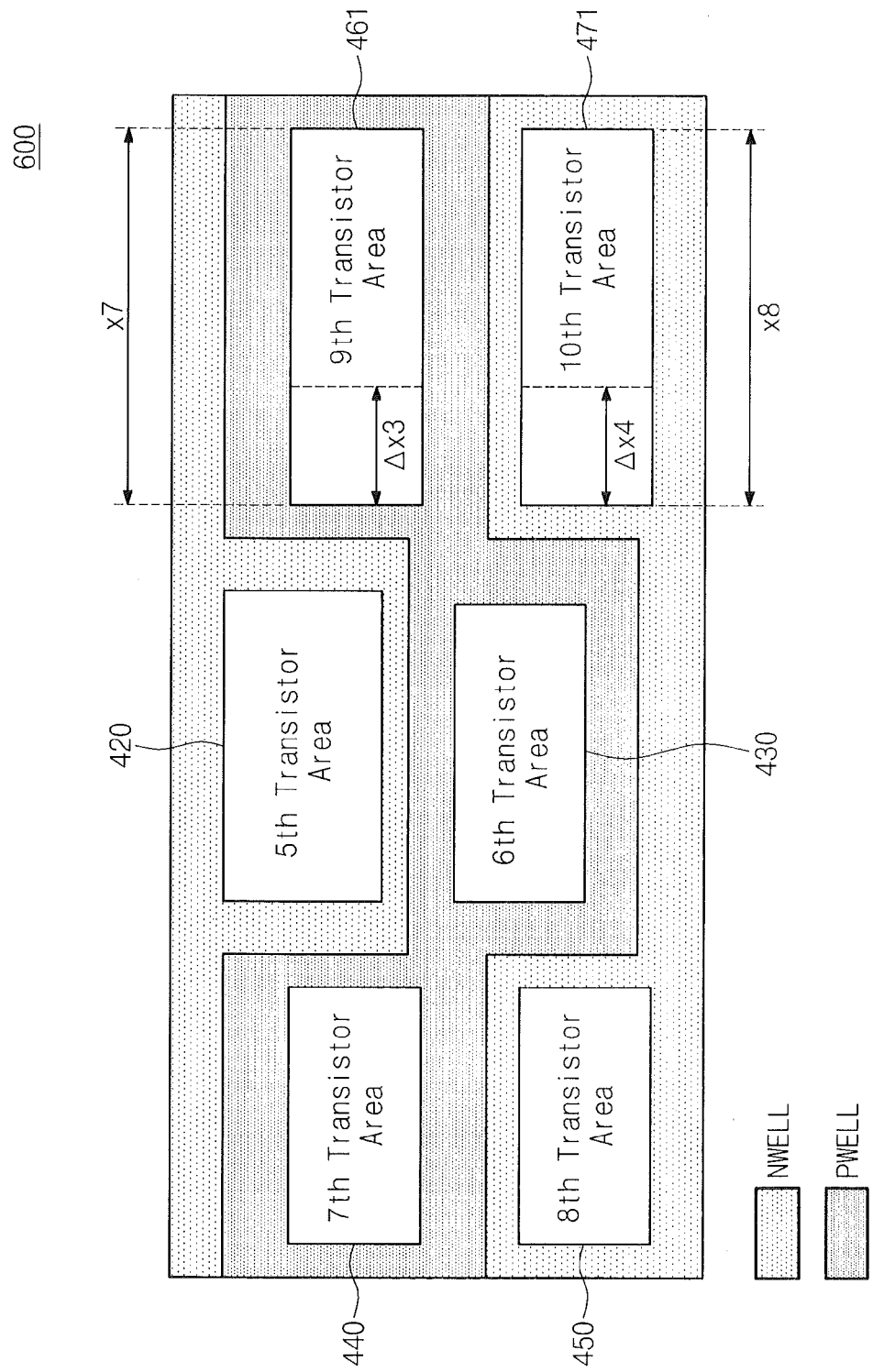
FIG. 10 is a block diagram illustrating another example in the case where fifth to tenth transistors shown in FIG. 8 change in area.

FIG. 9 is a block diagram illustrating an example in the case where the fifth to tenth transistors 420~470 shown in FIG. 8 change in area. As an example, compared with FIG. 8, FIG. 9 illustrates that fifth and sixth transistor regions 420 and 430 increase in area. The fifth and sixth transistor regions 420 and 430 shown in FIG. 8 have areas corresponding to first and second widths x1 and x2, respectively. Fifth and sixth transistor regions 421 and 431 shown in FIG. 9 have areas corresponding to seventh and eighth widths x7 and x8, respectively.

The seventh width x7 is wider than the third width x3 by a third change amount $\Delta x3$, and the eighth width x8 is wider than the fourth width x4 by a fourth change amount $\Delta x4$. The third transistor unit 550 and the fifth transistor units 570 are disposed in a first direction. Thus, a waste area is not formed although areas of the ninth transistor region 460 or the tenth transistor region 470 increase in the first direction or the opposite direction to the first direction. Similarly, a waste area is not formed even when areas of the tenth transistor regions increase in the first direction. Although areas of the seventh and eighth transistor regions 440 and 450 increase in the first direction or the opposite direction to the first direction, similar to the case where the areas of the ninth and tenth transistor regions 460 and 470 increase in the first direction or the opposite direction to the first direction, a waste area is not formed.

As described above, according to the embodiment of the inventive concept, waste area is not formed at logic cells included in a common logic circuit 30 supplied with a plurality of power supply voltages. Thus, an integration density of the common logic circuit is improved. To achieve these goals, integrated circuit devices according to embodiments of the invention include a substrate having a semiconductor substrate region therein containing multiple well regions of different conductivity type. According to some of these embodiments of the invention, a first semiconductor well region of first conductivity type is provided in the semiconductor substrate region. This first semiconductor well region has a first plurality of transistor regions therein arranged in a first zig-zag pattern extending across the semiconductor substrate region. At least some of the first plurality of transistor regions may have unequal widths when measured in a first direction along a length of the first zig-zag pattern. A second semiconductor well region of second conductivity type is also provided in the semiconductor substrate region. This second semiconductor well region has a second plurality of transistor regions therein arranged in a second zig-zag pattern extending across the semiconductor substrate region. This second zig-zag pattern is intertwined with the first zig-zag pattern. A plurality of first transistors of second conductivity type may be provided in the first plurality of transistor regions and a plurality of second transistors of first conductivity type may be provided in the second plurality of transistors regions. In some embodiments of the invention, the plurality of second transistors may include at least one second transistor that shares a gate electrode with a corresponding one of the plurality of first transistors.

According to still further embodiments of the invention, the second plurality of transistor regions may be contiguous with each other within the first semiconductor well region. In addition, at least some of the first plurality of transistor regions may be contiguous with each other. The second semiconductor well region may also form P-N rectifying junctions with the first semiconductor well region. This first semiconductor well region of first conductivity type may be an N-type region and the second semiconductor well region of second conductivity type may be a P-type region or vice versa. The plurality of first transistors of second conductivity type may be PMOS transistors and the plurality of second transistors of first conductivity type may be NMOS transistors or vice versa. Moreover, at least some of the PMOS transistors may be electrically coupled to power supply signal lines biased at unequal power supply voltages (e.g., VDD1, VDD2).

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An integrated circuit device, comprising:
   a substrate having a semiconductor substrate region therein;
   a first semiconductor well region of first conductivity type in the semiconductor substrate region, said first semiconductor well region having a first plurality of transistor regions therein arranged in a first zig-zag pattern across the semiconductor substrate region;
   a second semiconductor well region of second conductivity type in the semiconductor substrate region, said second semiconductor well region having a second plurality of transistor regions therein arranged in a second zig-zag pattern across the semiconductor substrate region that is intertwined with the first zig-zag pattern;
   a plurality of first transistors of second conductivity type in the first plurality of transistor regions; and
   a plurality of second transistors of first conductivity type in the second plurality of transistors regions, said plurality of second transistors comprising at least one second transistor that shares a gate electrode with a corresponding one of the plurality of first transistors.

2. The device of claim 1, wherein the second plurality of transistor regions are contiguous with each other.

3. The device of claim 2, wherein at least some of the first plurality of transistor regions are contiguous with each other.

4. The device of claim 2, wherein said second semiconductor well region forms P-N rectifying junctions with said first semiconductor well region.

5. The device of claim 1, wherein the first semiconductor well region of first conductivity type is an N-type region and the second semiconductor well region of second conductivity type is a P-type region or vice versa.

6. The device of claim 1, wherein the plurality of first transistors of second conductivity type are PMOS transistors and the plurality of second transistors of first conductivity type are NMOS transistors or vice versa.

7. The device of claim 1, wherein at least some of the first plurality of transistor regions have unequal widths when measured in a first direction along a length of the first zig-zag pattern.

8. The device of claim 6, wherein at least some of the PMOS transistors are electrically coupled to power supply signal lines biased at unequal power supply voltages.

9. An integrated circuit device comprising:
a first well extending in a first direction;
second and third wells adjacent to the first well in a second direction crossing the first direction and disposed in the first direction;
a fourth well adjacent to the second well in the second direction and having the same type as the third well;
a fifth well adjacent to the third well in the second direction and extending from the second well; and
transistors provided on the second to fifth wells.

10. The integrated circuit device as set forth in claim 9, further comprising:
a sixth well adjacent to the fourth well in the second direction and extending in the first direction.

11. The integrated circuit device as set forth in claim 9, wherein the first direction is perpendicular to the second direction.

12. The integrated circuit device as set forth in claim 9, wherein the first, third, and fourth wells are doped with a first type of dopants, and the second and fifth wells are doped with a second type of dopants.

13. The integrated circuit device as set forth in claim 9, wherein the transistors provided on the third well use a first power supply voltage.

14. The integrated circuit device as set forth in claim 13, wherein the transistors provided on the fourth well use a second power supply voltage.

15. The integrated circuit device as set forth in claim 9, wherein the transistors provided on the second and fifth wells use a ground voltage.

16. The integrated circuit device as set fourth in claim 9, further comprising:
capacitors provided on the second to fifth wells.

17. The integrated circuit device as set forth in claim 9, wherein the transistors provide on the second and fourth wells are configured to perform a first logical operation, and the transistors provided on the third and fifth wells are configured to perform a second logical operation.

18. The integrated circuit device as set forth in claim 9, further comprising:
a sixth well disposed adjacent to the fourth well in the second direction and extending in the first direction;
a seventh well disposed adjacent to the third well in the first direction and extending from the fifth well;
an eighth well disposed adjacent to the fifth well in the first direction and having the same type as the third and fourth wells; and
transistors provided on the seventh and eighth wells.

19. The integrated circuit device as set forth in claim 18, further comprising:
capacitors provided on the seventh and eighth wells.

20. A computing system comprising:
an integrated circuit device; and
a memory device configured to provide data to the integrated circuit device and store data processed at the integrated circuit device,
wherein the integrated circuit device comprises:
a first well extending in a first direction;
second and third wells adjacent to the first well in a second direction crossing the first direction and disposed in the first direction;
a fourth well adjacent to the second well in the second direction and having the same type as the third well;
a fifth well adjacent to the third well in the second direction and extending from the second well; and
transistors provided on the second to fifth wells.

* * * * *